（12) United States Patent
Ranjbar et al.

(10) Patent No.: US 8,842,031 B1
(45) Date of Patent: Sep. 23, 2014

(54) DELTA-SIGMA MODULATOR WITH LIMITER

(71) Applicant: Cirrus Logic, Inc., Austin, TX (US)

(72) Inventors: Mohammad Ranjbar, San Jose, CA (US); Bruce Eliot Duewer, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/932,830

(22) Filed: Jul. 1, 2013

(51) Int. Cl.
*H03M 3/00* (2006.01)
(52) U.S. Cl.
CPC ........................................ *H03M 3/44* (2013.01)
USPC .......................................... 341/143; 341/155
(58) Field of Classification Search
CPC ........................................................ H03M 3/456
USPC .................................................... 341/143, 155
See application file for complete search history.

(56) References Cited

U.S. PATENT DOCUMENTS

| 2,927,962 | A | 3/1960 | Cutler | |
|---|---|---|---|---|
| 5,012,244 | A | 4/1991 | Wellard et al. | |
| 6,362,762 | B1 * | 3/2002 | Jensen et al. | 341/143 |
| 6,724,332 | B1 | 4/2004 | Melanson | |
| 6,822,594 | B1 * | 11/2004 | Melanson et al. | 341/143 |
| 7,123,177 | B2 * | 10/2006 | Cheng et al. | 341/143 |
| 7,205,917 | B2 * | 4/2007 | Magrath | 341/143 |
| 7,358,881 | B2 * | 4/2008 | Melanson | 341/144 |
| 2004/0190728 | A1 | 9/2004 | Melanson | |
| 2005/0038847 | A1 * | 2/2005 | Cheng et al. | 709/201 |

* cited by examiner

*Primary Examiner* — Jean B Jeanglaude
(74) *Attorney, Agent, or Firm* — Fulbright & Jaworski LLP

(57) ABSTRACT

The stability of a delta-sigma modulator may be improved by limiting a value within the delta-sigma modulator. For example, the value provided to a quantizer may be limited, by a limiter circuit in the delta-sigma modulator, to a value within a single step range of the quantizer. The limiter circuit may be placed in an inner loop of the delta-sigma modulator to decouple the stability of the inner loop from an outer loop. For example, a delta-sigma modulator may be constructed with an inner loop having a sixth order and an outer loop having a second order, in which the stability of the delta-sigma modulator is proportional to that of a second order.

17 Claims, 5 Drawing Sheets

DELTA-SIGMA MODULATOR WITH LIMITER

FIELD OF THE DISCLOSURE

The instant disclosure relates to electronic devices. More specifically, this disclosure relates to delta-sigma modulators.

BACKGROUND

Delta-sigma modulators are electronic circuits for performing analog-to-digital conversion, digital-to-analog conversion, or digital-to-digital conversion. A basic delta-sigma modulator for analog-to-digital conversion includes an integrator for integrating a difference between an input signal and a feedback signal. The output of the integrator is supplied to a threshold amplifier. The output of the threshold amplifier is input to an impulse circuit, which provides the feedback signal for integration. The output of the threshold amplifier is also supplied to a counter, which completes the digital conversion process.

Higher-order delta-sigma modulators for analog-to-digital conversion may include additional integrators with additional feedback loops. Higher-order delta-sigma modulators allow additional zeroes to be obtained in a noise transfer function. Single-order delta-sigma modulators are generally stable, and second-order modulators can also be designed as generally stable. However, higher-order delta-sigma modulators are generally unstable. Conventionally, stability analysis is performed on higher order delta-sigma modulators to determine what conditions cause the higher-order delta-sigma modulator to become unstable. Instability problems increase as the order of the delta-sigma modulator increases beyond the second order, such as with a third-order or higher delta-sigma modulator.

One conventional solution to the instability problem is feedback steering. In the side-car approach, an alternate lower-order delta-sigma modulator is constructed along-side a higher-order delta-sigma modulator. For example, a second-order delta-sigma modulator may be constructed alongside a fourth-order delta-sigma modulator. When the higher-order feedback loop becomes unstable, an output of the side-car stage of the delta-sigma modulator was substituted for the higher-order feedback loop. The side-car approach provides an alternative operation for the delta-sigma modulator, but does not reduce the instability of the delta-sigma modulator.

Shortcomings mentioned here are only representative and are included simply to highlight that a need exists for improved electronic devices, particularly in consumer-level devices. Embodiments described here address certain shortcomings but not necessarily each and every one described here or known in the art.

SUMMARY

A limiter may be placed inside a delta-sigma modulator to decouple the instability of different loops within the delta-sigma modulator. For example, when a delta-sigma modulator includes two loops, a limiter may be placed between the two feedback loops. The limiter may reduce or eliminate coupling of the stability of one feedback loop from the other feedback loop. In certain embodiments, the limiter may be placed before a quantizer to prevent the quantizer from receiving an input value outside of a valid range of input values for the quantizer. For example, the limiter may restrict input values to the quantizer that do not exceed one step of the quantizer.

In one embodiment, an apparatus may include a first loop of a delta-sigma modulator, a second loop of the delta-sigma modulator, and a first limiter configured to decouple an instability of the first loop of the delta-sigma modulator from an instability of the second loop of the delta-sigma modulator. The overall order of the delta-sigma modulator may be determined by the order of the second loop, which may be a second-order, increased by an arbitrary-order according to a number of zeroes in the first loop. The limiter may decouple the instability of the first loop and the second loop, such that the stability of the delta-sigma modulator is proportional to the order of the second loop, which may be second-order.

In certain embodiments, the first loop is an inner loop, the second loop is an outer loop, the first loop of the delta-sigma modulator has an order equal to or higher than a second order, the second loop of the delta-sigma modulator is a second-order loop, the first limiter is integrated into the first loop of the delta-sigma modulator, the first loop implements a noise transfer function having zeroes defined by the processing block, the noise transfer function is a sixth-order noise transfer function, the processing block defines a zero at $F_s/2$ to allow double sampling, and/or the first limiter is configured to substitute a low value when an input to the first limiter is below a first threshold and is configured to substitute a high value when an input to the first limiter is above a second threshold.

The apparatus may also include a first subtractor coupled to the second loop of the delta-sigma modulator and coupled to the first limiter; a second subtractor coupled to the first limiter and to a processing block, in which the processing block is also coupled to the first subtractor to form the first loop; and/or a quantizer in the first loop, in which the first threshold and the second threshold are based, at least in part, on an input range for the quantizer.

According to another embodiment, a method may include limiting a signal value of a first loop of a delta-sigma modulator, and providing the limited signal value to a second loop of the delta-sigma modulator.

In certain embodiments, the first loop is an inner loop of the delta-sigma modulator, the second loop is an outer loop of the delta-sigma modulator, the step of defining zeroes comprises inserting delay elements in the first loop, the step of defining zeroes comprises defining a zero at $F_s/2$ to allow double sampling, the noise transfer function is a sixth-order noise transfer function, the step of limiting the signal value comprises substituting a low value when the signal value is below a first threshold and substitute a high value when the signal value is above a second threshold, and/or the step of providing the limited signal value to a second loop comprises providing the limited signal value to a quantizer of the second loop, in which the first threshold and the second threshold are based, at least in part, on a valid input range for the quantizer.

The method may also include generating a noise transfer function of an order equal to or higher than a second order in the first loop, in which the limited signal value decouples an instability of the first loop from an instability of the second loop, defining zeroes of a noise transfer function in a processing block of the first loop, subtracting an output of the first loop from the limited signal value, providing the subtracted value to a processing block of the first loop, and/or subtracting an output of the first loop processing block from a processing block of the second loop.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the specific embodiments disclosed may be readily utilized as a basis for modifying or designing other structures for carrying out the same or similar purposes. It should also be realized that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
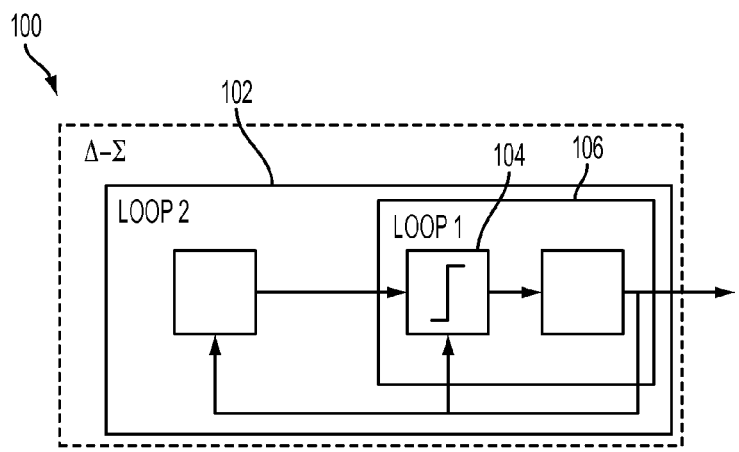
FIG. 1 is a block diagram illustrating a limiter between two loops of a second-order delta-sigma modulator according to one embodiment of the disclosure.

FIG. 1 is a block diagram illustrating a limiter between two loops of a second-order delta-sigma modulator according to one embodiment of the disclosure. A second loop 102 of a second-order delta-sigma modulator 100 may be separated from a first loop 106 by a limiter 104. The limiter 104 may inhibit instability in the first loop 106 of the modulator 100 from causing unexpected results in a the second loop 102. For example, if the first loop 106 becomes unstable and produces an output outside of a stable range of values, the limiter 104 prevents the value from being provided to the second loop 102. Instead, the limiter 104 may alter the value produced by the first loop 106 to a value in a certain range that does not lead to instability in the second loop 102. For example, when the output of the first loop 106 exceeds a maximum value, the limiter 104 provides as input to the second loop 102 that maximum value. In certain embodiments, the limiter 104 may be integrated into the first loop 106. For example, the limiter 104 may be integrated into the first loop 106 to restrict an input value provided to a quantizer of the first loop 106 to a range corresponding to a step size of the quantizer.

The limiter 104 may include analog elements, digital elements, and/or a mix of analog and digital elements. In one embodiment, the limiter 104 may be an analog limiter. In another embodiment, the limiter 104 may be a general processor programmed to substitute an upper and lower output value when an input to the limiter 104 exceeds a upper or lower limit.

Figure 2:
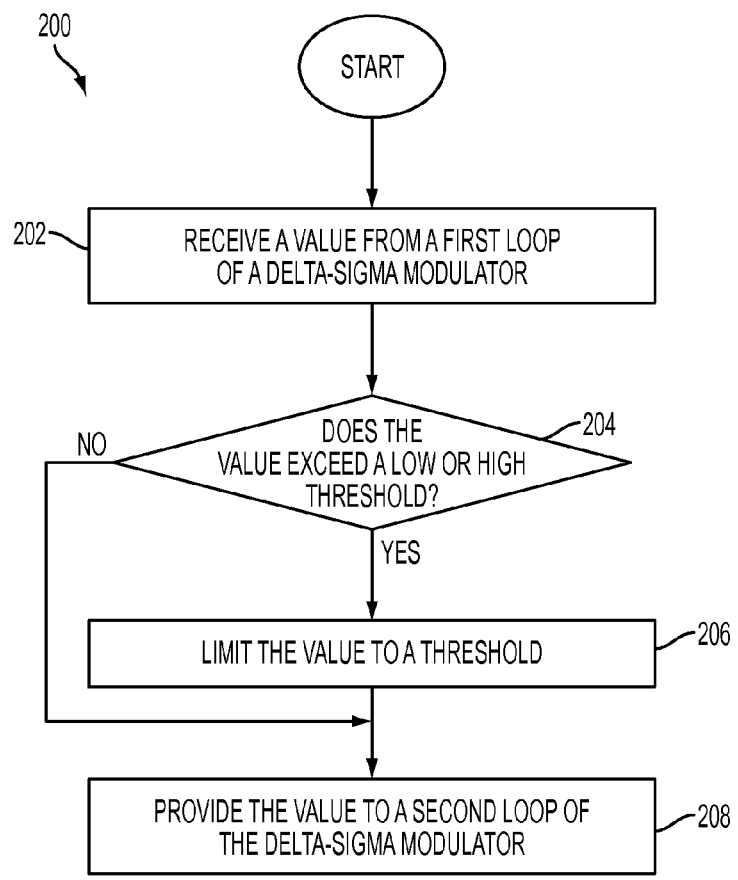
FIG. 2 is a flow chart illustrating a method for limiting the input value to a delta-sigma modulator according to one embodiment.

FIG. 2 is a flow chart illustrating a method for limiting the input value to a delta-sigma modulator according to one embodiment. A method 200 begins at block 202 with receiving a value from a first loop of a delta-sigma modulator. At block 204, it is determined whether the value exceeds a low or high threshold. According to one embodiment, the low and/or high threshold may correspond to input limits of a quantizer of the delta-sigma modulator. If so, then the value is limited to the threshold at block 206 and the value is provided to a second loop of the delta-sigma modulator at block 208. If the threshold is not exceeded at block 204, then the value is provided to a second loop of the delta-sigma modulator at block 208.

Figure 3:
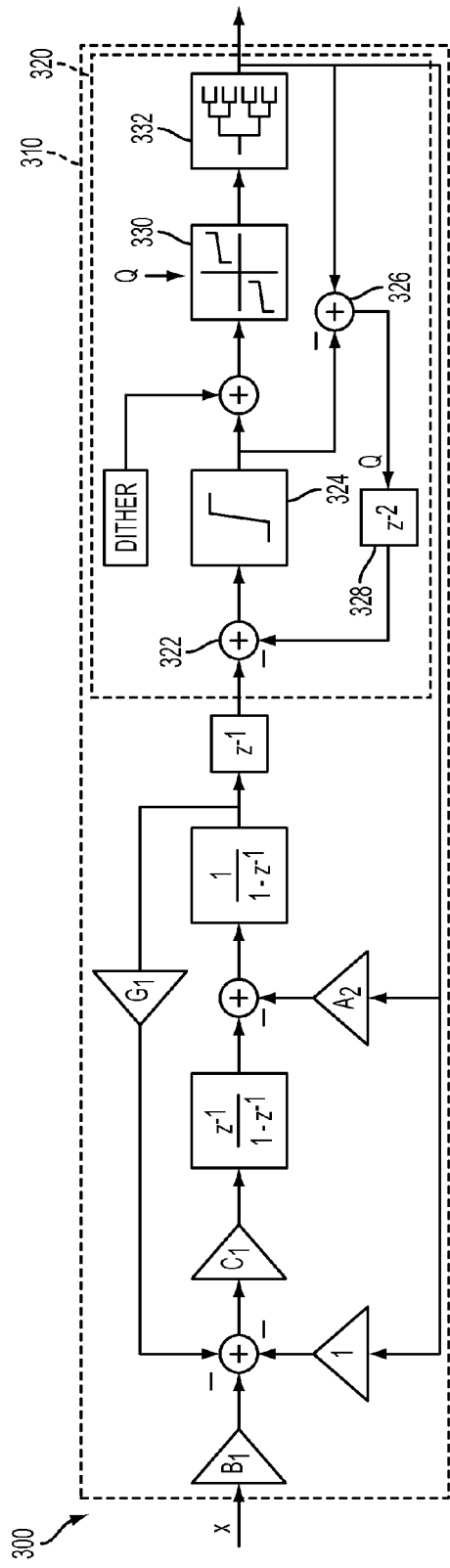
FIG. 3 is a block diagram illustrating a delta-sigma modulator with a limiter according to one embodiment of the disclosure.

FIG. 3 is a block diagram illustrating a delta-sigma modulator with a limiter according to one embodiment of the disclosure. A delta-sigma modulator 300 may include a first loop 320, such as an inner loop, and a second loop 310, such as an outer loop. The second loop 310 may include a first-, second-, or higher-order section of a delta-sigma modulator. For example, the second loop 310 of the modulator 300 of FIG. 3 is shown as a second-order section, and the first loop 320 is shown as a noise-recycling back-end section. The stability of the second loop 310 may determine the stability or relative stability of the delta-sigma modulator 300. For example, when the second loop 310 is a second-order loop then the delta-sigma modulator 300 may have stability similar to or equal to a second-order loop regardless of the order of the first loop 320. For example, even when the first loop 320 is a higher-order loop, such as a fifth-order loop, the delta-sigma modulator 300 may have a stability similar to a second-order loop. The decoupling of the stability of the delta-sigma modulator 300 from the stability of a higher-order first loop 320 may be achieved through the use of a limiter described below.

The first loop 320 may include a summer block 322, or subtractor, that receives an input from the second loop 310. The summer block 322 may also receive input from a processing block 328, which receives input from a summer block 326 summing the output of a shaper 332 and a limiter 324. The limiter 324 may limit an input to the quantizer 330 to a value within a certain range. The limiter 324 may improve the predictability and reduce the instability of the modulator 300 by applying limits to the output of the summer block 322. According to one embodiment, the limiter 324 provides an input to the quantizer 330 that is limited to a value between a maximum and minimum input value for the quantizer 330 or to a value that corresponds to only a single step of the quantizer 330.

Limiters may be implemented in a delta-sigma modulator in other embodiments to reduce the instability of the delta-sigma modulator. For example, limiters may be placed in delta-sigma modulators as shown in FIG. 4 and FIG. 5 to limit to a certain range an input to a quantizer of the delta-sigma modulator.

Figure 4:
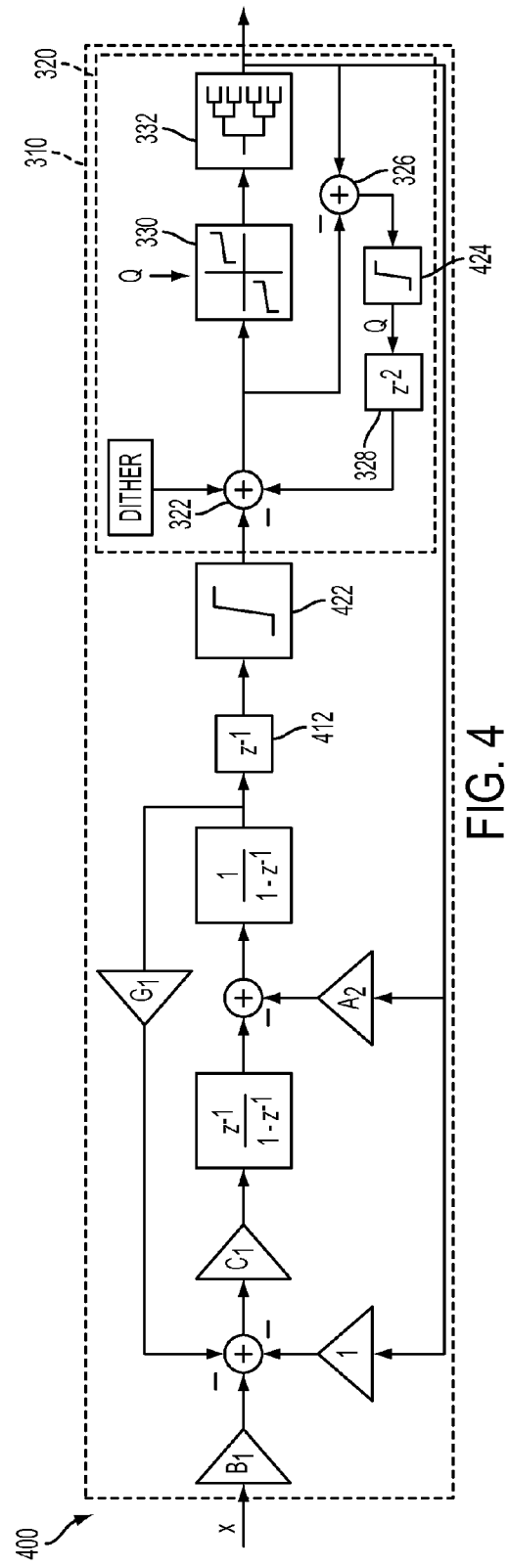
FIG. 4 is a block diagram illustrating a delta-sigma modulator with a limiter according to another embodiment of the disclosure.

FIG. 4 is a block diagram illustrating a delta-sigma modulator with a limiter according to another embodiment of the disclosure. A first limiter 422 may limit an input to the summer block 322 of the first loop 320. A second limiter 424 may limit another input to the summer block 322 by limiting an input to the processing block 328. The limiters 422 and 424 may be configured such that when the summer block 322 sums the output values of the limiters 422 and 424, the output of the summer block 322 does not exceed a certain range, such as the input range of the quantizer 330.

Figure 5:
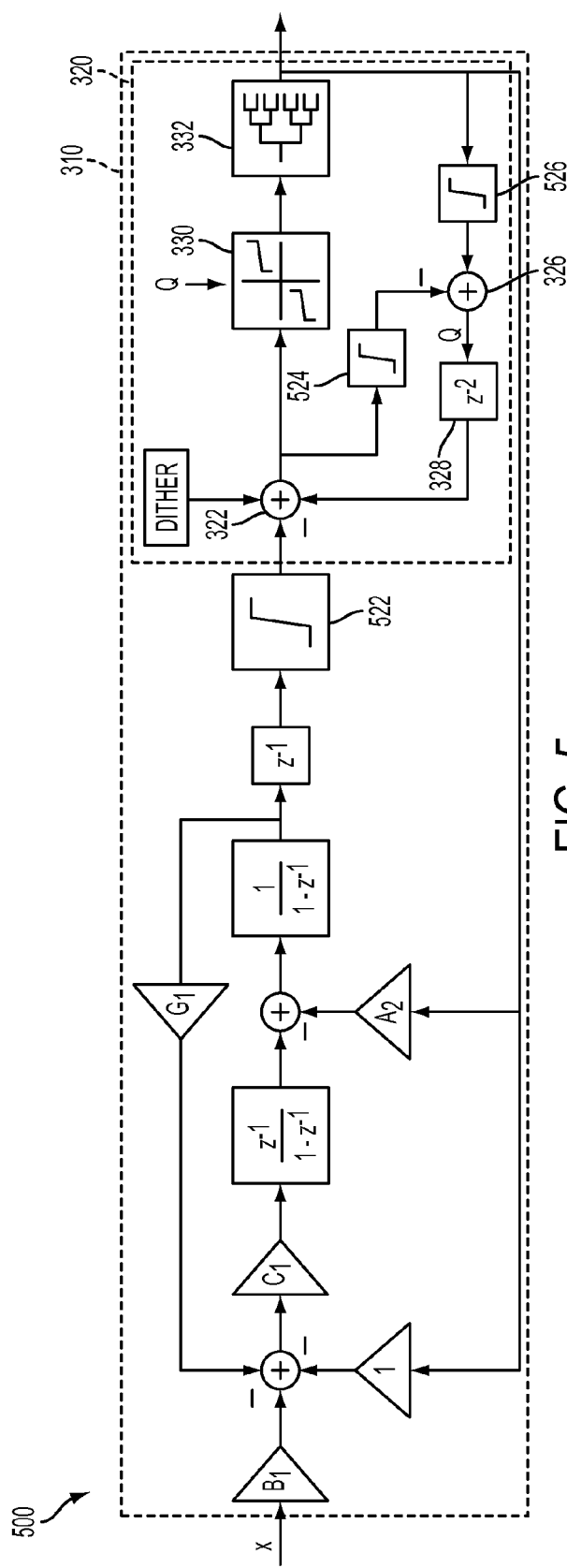
FIG. 5 is a block diagram illustrating a delta-sigma modulator with a limiter according to a further embodiment of the disclosure.

FIG. 5 is a block diagram illustrating a delta-sigma modulator with a limiter according to a further embodiment of the disclosure. A first limiter 522 may limit an input to the summer block 322 of the first loop 320. A second limiter 524 may limit an input to the summer block 326 from the summer block 322. A third limiter 526 may limit an input to the summer block 326 from the shaper 332. The limiters 522, 524, and 526 may be configured such that when the summer block 322 sums the output values of the limiters 522, 524, and 526, the output of the summer block 322 does not exceed a certain range, such as the input range of the quantizer 330.

Limiters in the first loop 320, such as in the configurations of FIGS. 3, 4, and 5, may improve delta-sigma modulator stability. The limiters may increase the likelihood that a signal entering the quantizer will remain smaller than the full-scale of the quantizer. In this situation, the quantization error may be a small and bounded signal, such that it will not affect the modulator's overload behavior. The limiter may also decouple the signal transfer functions (STFs) and noise transfer functions (NTFs) by ensuring that only the quantization error flows into a back-end loop of the modulator. As a result, the modulator stability and overload recovery behavior of the modulator may simulate the lower-order front-end portion of the modulator. For example, when the high-order modulator would become unstable, the front portion may receive the additional energy, while the response of the back-end portion is bounded. In certain embodiments, the modulator as a whole may behave with the stability of a second-order modulator but have higher-order capabilities. By decoupling the stability of a front-end portion and the back-end portion of a modulator, a modulator with higher-order capability may be constructed without significantly increasing the instability of the modulator.

A higher order modulator allows better control over the noise transfer function (NTF) of the delta-sigma modulator, such as by allowing an increase in the number of zeroes of the NTF. According to one embodiment, an outer loop, such as the second loop 310 may be a second-order loop, and an inner loop, such as the first loop 320, may be a higher-order loop, such as a sixth-order loop. In this embodiment, a 4-phase digital-to-analog converter may be implemented without increasing stability proportionally with the increasing instability of a higher-order inner loop.

Figure 6:
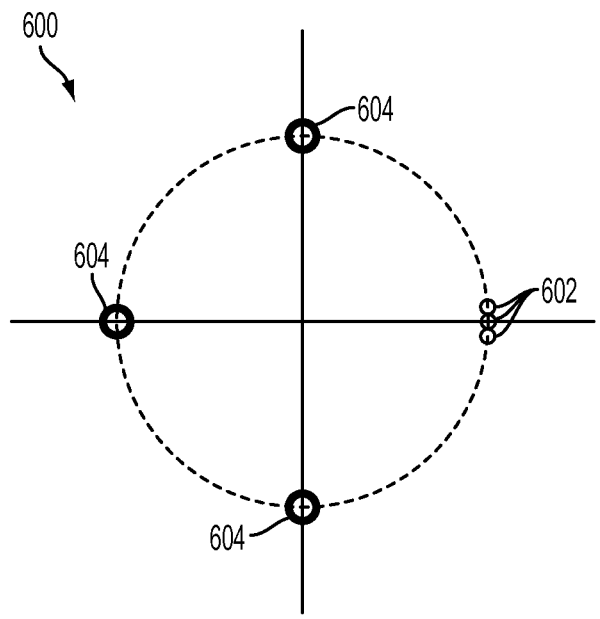
FIG. 6 is a graph illustrating placement of in-phase and out-of-phase zeroes for a noise transfer function according to one embodiment of the disclosure.
Figure 7:
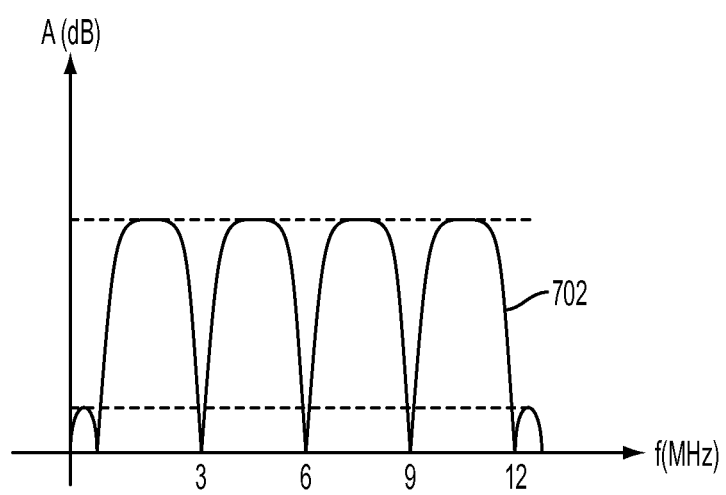
FIG. 7 is a graph illustrating a sixth-order noise transfer function according to one embodiment of the disclosure.

FIG. 6 is a graph illustrating placement of in-phase and out-of-phase zeroes for a noise transfer function according to one embodiment of the disclosure. A graph 600 illustrates zeroes of a noise transfer function on a unit circle. The zeroes may include in-phase zeroes 602 and out-of-phase zeroes 604. The out-of-phase zeroes 604 may be implemented through a processing block of a higher-order inner loop, such as the processing block 328 of FIG. 3. The processing block may include delay elements and/or variable delay elements. FIG. 7 is a graph illustrating a sixth-order noise transfer function according to one embodiment of the disclosure. A line 702 illustrates a noise transfer function with zeroes corresponding to the zeroes 602 and 604 of FIG. 6.

The placement of out-of-phase zeroes obtained by the inner loop may be selected to allow double-sampling. For example, an inner loop may have a zero placed at a $F_s/2$, where $F_s$ is the sampling frequency. Double sampling of a signal for conversion by a delta-sigma modulator may allow circuit design changes that decrease a die size of a circuit for a holding stage of the converter. For example, with double-sampling, a capacitance of a sampling capacitor may be reduced. With double sampling, the capacitor size may be halved, which corresponds to a reduction in die area occupied by the capacitor by approximately half. Increased over-sampling of a DAC may be obtained with a multi-phase modulator. For example, with a four-phase DAC, the capacitor size may be quartered, which corresponds to a reduction in die area occupied by the capacitor by approximately one quarter.

Figure 8:
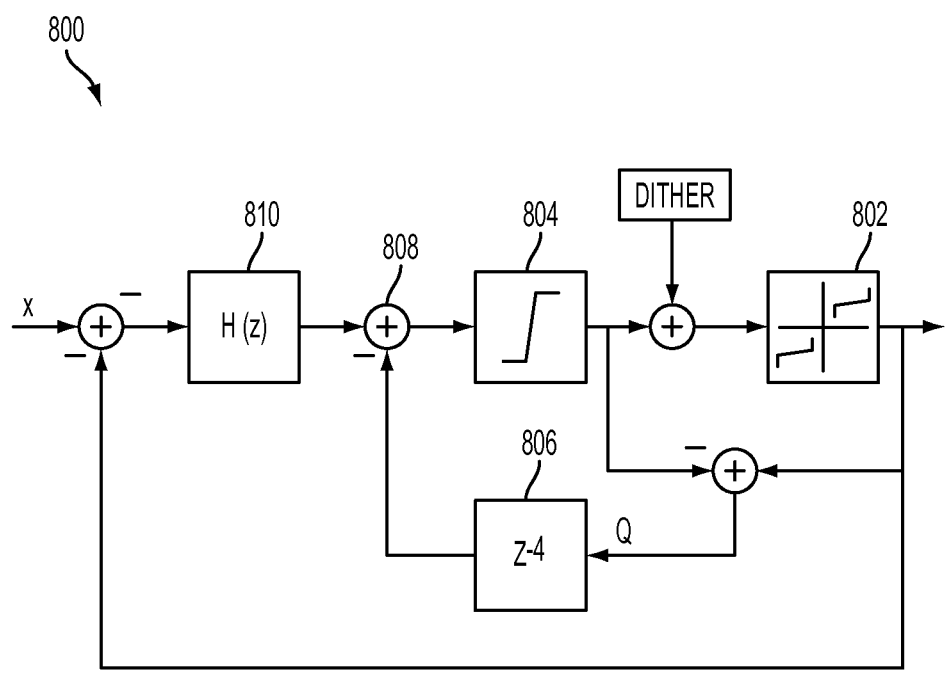
FIG. 8 is a block diagram illustrating a portion of a multi-phase pulse-width modulated current-mode digital to analog converter with a limiter according to one embodiment of the disclosure.

A delta-sigma modulator with improved stability from limiting values within loops of the delta-sigma modulator may be used in a pulse-width-modulated digital-to-analog converter (PWM DAC). FIG. 8 is a block diagram illustrating a portion of a multi-phase pulse-width modulated current-mode digital to analog converter with a limiter according to one embodiment of the disclosure. A portion 800 of a delta-sigma modulator may include a summer block 808, which receives input from a processing block 806 and a transfer function 810. The output of the summer block 808 is provided to a limiter 804, which outputs the value of the summer block 808 limited to a specific range to a quantizer 802. Feedback from the quantizer 802 is provided to the processing block 806 and the processing block 810. The limiter 804 maintains the stability of the delta-sigma modulator by reducing the likelihood of a value exceeding the valid input range of the quantizer 802. The processing block 806, $z^{-4}$, may produce zeroes in a noise transfer function at integer multiples of $F_s/4$, where $F_s$ is the sampling frequency, and at direct current (DC or 0 Hz). Thus, the portion 800 facilitates construction of a multi-phase pulse-width modulated current-mode digital to analog converter with improved stability.

Previously implementations of PWM DACs passed multi-phase PWM waveforms through separate shift registers to reduce quantization noise. However, this previous implementations involved placing zeroes in the NTF to prevent noise fold-back into a signal band. Creating zeroes with a higher-order inner loop with a stability decoupled from an outer loop, as described above with reference to FIGS. 1-5, allows the design of a PWM DAC with improved stability over previous implementations.

The use of a limiter in a delta-sigma modulator for signal processing may initially be counterintuitive, because design of transfer functions for signal processing generally relies on linear operation of an integrated circuit, whereas a limiter is a non-linear component of an integrated circuit. However, the non-linearity introduced by a limiter placed within the modulator may reduce instability and improve the predictability of the modulator, such as when the limiter limits errors generated by a quantizer receiving values outside of a valid input range.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain of its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
   a first loop of a delta-sigma modulator;
   a second loop of the delta-sigma modulator; and
   a first limiter configured to separate a set of stability characteristics of the first loop of the delta-sigma modulator from another set of stability characteristics of the second loop of the delta-sigma modulator;
   wherein the first loop of the delta-sigma modulator has an order higher than a second order and the second loop of the delta-sigma modulator is a second-order loop;
   wherein the first limiter is integrated into the first loop of the delta-sigma modulator; and
   wherein the first loop implements a noise transfer function having zeroes.

2. The apparatus of claim 1, in which the first loop is an inner loop, and in which the second loop is an outer loop.

3. The apparatus of claim 1, in which the first limiter is configured to substitute a low value when an input to the first limiter is below a first threshold and is configured to substitute a high value when an input to the first limiter is above a second threshold.

4. The apparatus of claim 3, further comprising a quantizer in the first loop, in which the first threshold and the second threshold are based, at least in part, on an input range for the quantizer.

5. The apparatus of claim 1, further comprising:
   a first subtractor coupled to the second loop of the delta-sigma modulator and coupled to the first limiter; and
   a second subtractor coupled to the first limiter and to a processing block, in which the processing block is also coupled to the first subtractor to form the first loop.

6. The apparatus of claim 5, in which the first loop implements a noise transfer function having zeroes defined by the processing block.

7. The apparatus of claim 6, in which the noise transfer function is a sixth-order noise transfer function.

8. The apparatus of claim 6, in which the processing block defines a zero at $F_s/2$ to allow double sampling.

9. A method, comprising:
   limiting a signal value of a first loop of a delta-sigma having an order higher than a second order and implementing a noise transfer function having zeroes, wherein the step of limiting occurs within the first loop of the delta-sigma modulator; and
   providing the limited signal value to the second loop of the delta-sigma modulator to separate a set of stability characteristics of the first loop of the delta-sigma modulator from another set of stability characteristics of the second loop of the delta-sigma modulator.

10. The method of claim 9, in which the step of limiting the signal value comprises substituting a low value when the signal value is below a first threshold and substitute a high value when the signal value is above a second threshold.

11. The method of claim 10, in which the step of providing the limited signal value to a second loop comprises providing the limited signal value to a quantizer of the second loop, in which the first threshold and the second threshold are based, at least in part, on a valid input range for the quantizer.

12. The method of claim 9, in which the first loop is an inner loop of the delta-sigma modulator, and in which the second loop is an outer loop of the delta-sigma modulator.

13. The method of claim 9, further comprising:
   subtracting an output of the first loop from the limited signal value;
   providing the subtracted value to a processing block of the first loop; and
   subtracting an output of the first loop processing block from a processing block of the second loop.

14. The method of claim 9, further comprising defining zeroes of the noise transfer function in a processing block of the first loop.

15. The method of claim 14, in which the step of defining zeroes comprises inserting delay elements in the first loop.

16. The method of claim 14, in which the step of defining zeroes comprises defining a zero at $F_s/2$ to allow double sampling.

17. The method of claim 14, in which the noise transfer function is a sixth-order noise transfer function.

* * * * *